(12) United States Patent
Chi et al.

(10) Patent No.: US 12,135,497 B2
(45) Date of Patent: Nov. 5, 2024

(54) RANDOM WEIGHT INITIALIZATION OF NON-VOLATILE MEMORY ARRAY

(71) Applicant: INTERNATIONAL BUSINESS MACHINES CORPORATION, Armonk, NY (US)

(72) Inventors: Cheng Chi, Jersey City, NJ (US); Takashi Ando, Eastchester, NY (US); Reinaldo Vega, Mahopac, NY (US); Praneet Adusumilli, Somerset, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 563 days.

(21) Appl. No.: 17/490,454

(22) Filed: Sep. 30, 2021

(65) Prior Publication Data

US 2023/0094719 A1 Mar. 30, 2023

(51) Int. Cl.
*G03F 1/36* (2012.01)
*G03F 1/38* (2012.01)
*G03F 1/92* (2012.01)

(52) U.S. Cl.
CPC .................. *G03F 1/36* (2013.01); *G03F 1/38* (2013.01); *G03F 1/92* (2013.01)

(58) Field of Classification Search
CPC ..................................... G03F 1/36; G03F 1/38
USPC .......................................................... 716/53
See application file for complete search history.

(56) References Cited

U.S. PATENT DOCUMENTS

| | | | |
|---|---|---|---|
| 7,376,930 B2 | 5/2008 | Wampler et al. | |
| 7,512,928 B2 | 3/2009 | Jessen et al. | |
| 8,099,684 B2 | 1/2012 | Meiring et al. | |
| 9,904,757 B2 | 2/2018 | Abdo et al. | |
| 10,198,550 B2 | 2/2019 | Lutich | |
| 10,209,615 B2 | 2/2019 | Li et al. | |
| 10,386,714 B2 | 8/2019 | Kohli et al. | |
| 2005/0053848 A1 | 3/2005 | Wampler et al. | |
| 2005/0136340 A1 | 6/2005 | Baselmans et al. | |
| 2007/0035031 A1 | 2/2007 | Jessen et al. | |
| 2010/0021825 A1* | 1/2010 | Kodama | G03F 1/36 430/5 |
| 2010/0175040 A1 | 7/2010 | Meiring et al. | |
| 2011/0029938 A1 | 2/2011 | Nojima et al. | |
| 2017/0053058 A1* | 2/2017 | Yu | G06F 30/398 |
| 2017/0139330 A1* | 5/2017 | Hotzel | G03F 1/50 |
| 2017/0193150 A1 | 7/2017 | Abdo et al. | |
| 2018/0096839 A1* | 4/2018 | Kim | H01L 21/32139 |
| 2018/0196340 A1 | 7/2018 | Kohli et al. | |
| 2018/0285510 A1 | 10/2018 | Lutich | |
| 2018/0341173 A1 | 11/2018 | Li et al. | |

(Continued)

FOREIGN PATENT DOCUMENTS

WO 2018215188 A1 11/2018
WO 2019162204 A1 8/2019

*Primary Examiner* — Jack Chiang
*Assistant Examiner* — Suchin Parihar
(74) *Attorney, Agent, or Firm* — Tutunjian & Bitetto, P.C.; Samuel Waldbaum (57) ABSTRACT

A memory device is provided. The memory device includes a main feature disposed beneath a surface of a photolithographic mask. The memory device further includes at least one Sub-Resolution Assistant Feature (SRAF) proximate to the main feature beneath the surface. The main feature has an electrical conductivity based on an area relationship with the at least one SRAF.

20 Claims, 6 Drawing Sheets

(56) References Cited

U.S. PATENT DOCUMENTS

| | | | | |
|---|---|---|---|---|
| 2021/0374936 A1* | 12/2021 | Koopman | ................ | G06N 3/08 |
| 2022/0082949 A1* | 3/2022 | Hubaux | .............. | G03F 7/70616 |
| 2022/0187713 A1* | 6/2022 | Middlebrooks | ........ | G06N 3/045 |
| 2022/0284344 A1* | 9/2022 | Ma | ......................... | G06N 3/082 |
| 2023/0206037 A1* | 6/2023 | Wetmore | ................. | G06N 3/08 |
| | | | | 706/15 |
| 2023/0206112 A1* | 6/2023 | Chi | ..................... | G03F 7/70441 |
| | | | | 716/55 |
| 2024/0054669 A1* | 2/2024 | Houben | ................. | G06T 7/593 |

\* cited by examiner

RANDOM WEIGHT INITIALIZATION OF NON-VOLATILE MEMORY ARRAY

BACKGROUND

The present invention generally relates to memory devices, and more particularly to random weight initialization of a non-volatile memory array.

In neural networks, there exists weights between every two layers. The linear transformation of these weights and the values in the previous layers pass through a non-linear activation function to produce the values of the next layer.

Software-based initialization requires both row and column decoders in the array design layout, which are one-time use for initialization only. This consumes layout area with no added benefit after initialization. Methods to obviate the need for these decoders provide opportunity to place larger and/or more arrays on chip.

The initial values of the weights play an important role in training accuracy. The initial weights cannot be all zero. That is, symmetry-breaking is needed for weight optimization.

The initial weights cannot be completely random. That is, the distribution needs to be under control to avoid too small or too large signal as it passes through each layer.

Thus, there is a need for an improved approach to weight initialization for neural networks.

SUMMARY

According to aspects of the present invention, a memory device is provided. The memory device includes a main feature disposed beneath a surface of a photolithographic mask. The memory device further includes at least one Sub-Resolution Assistant Feature (SRAF) proximate to the main feature beneath the surface. The main feature has an electrical conductivity based on an area relationship with the at least one SRAF.

According to other aspects of the present invention, a method is provided for forming a memory device. The method includes forming a main feature disposed beneath a surface of a photolithographic mask. The method further includes forming at least one Sub-Resolution Assistant Feature (SRAF) proximate to the main feature beneath the surface. The main feature has an electrical conductivity which sets a weight initialization value for the main feature based on an area relationship with the at least one SRAF.

According to yet other aspects of the present invention, a memory device is provided. The memory device includes a plurality of main features disposed beneath a surface of a photolithographic mask. The memory device further includes at least one respective Sub-Resolution Assistant Feature (SRAF) proximate to each of the plurality of main features beneath the surface. Each of the plurality of main features has an electrical conductivity based on an area relationship with the at least one SRAF proximate thereto.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention are directed to random weight initialization of a non-volatile memory array.

According to one or more embodiments of the present invention, different Sub-Resolution Assistant Features (SRAFs) provide random weight initialization for non-volatile memory. Convoluted with a lithography process, this design can be used to optimize the weight initialization model.

Embodiments of the present invention provide an easy way to maintain the same device area (which is determined by the main feature, and not the added SRAFs). The main feature can be, for example, but is not limited to, features above the resolution limit of the lithography system, and formed from a plurality of adjacent 1D and 2D patterns with designed size and spacing. The added SRAFs can be of any shape, and are preferably of quadrilateral shape. The added SRAFs can be formed from small features, which are below the resolution limit of the imaging systems. SRAFs are narrow lines or spaces placed adjacent to a primary feature in order to make a relatively isolated primary line behave lithographically more like a dense line. Isolated features will almost always print at a feature size significantly different than the same mask feature surrounded by other features. An SRAF, as the name implies, is a sub-resolution feature that is not meant to print. Typically, the SRAFs are formed from a metal. In embodiments, the SRAFS are portions of unconnected metal lines or shapes placed proximate to the main feature to affect the Local Critical Dimension Uniformity (LCDU) within the device area of the main feature.

Embodiments of the present invention provide a programmable way to control local Critical Dimension (CD) distribution by changing a placement and size of assistant features in the design stage.

Embodiments of the present invention can use both periodic SRAF and random SRAF when designing an array to achieve a broader range of device area distribution. Periodic SRAF achieves different weight initializations due to differences in the periodic SRAFs resulting from the lithography process.

Embodiments of the present invention can be applied to various lithography tools including Deep Ultra-Violet (DUV) and Extreme Ultra-Violet (EUV) lithography tools. Of course, the present invention is not limited to the preceding lithography tools and, thus, other lithography tools can also be used in accordance with the teachings of the present invention.

Embodiments of the present invention can involve a memory device including one of a non-filamentary RRAM, a pillar-cell Phase Change Memory (PCM), a Ferroelectric tunnel junction (FTJ), and an electrochemical RAM (ECRAM). Of course, the present invention can also be used with other types of memories, while maintaining the spirit of the present invention. The memory device may be included in a deep neural network having two or more hidden layers.

Figure 1:
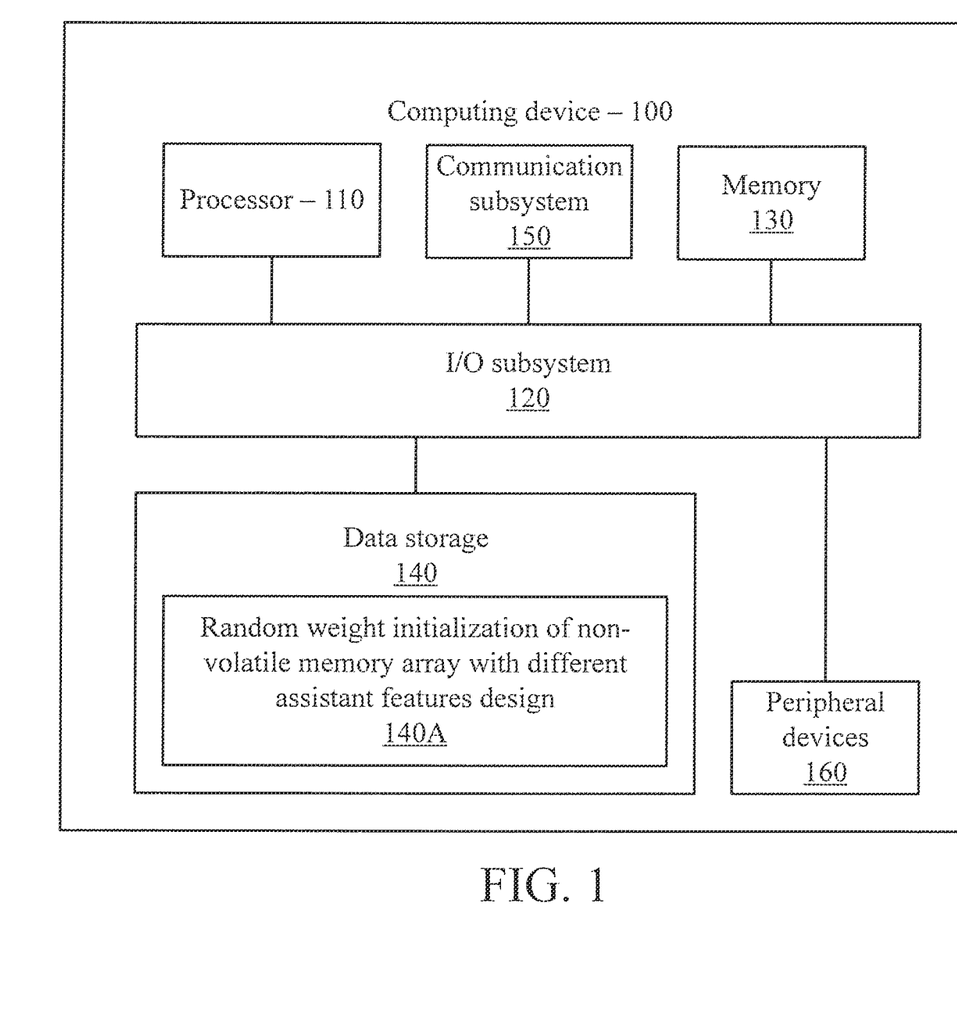
FIG. 1 is a block diagram showing an exemplary computing device, in accordance with an embodiment of the present invention.

FIG. 1 is a block diagram showing an exemplary computing device 100, in accordance with an embodiment of the present invention. The computing device 100 is configured for random weight initialization of non-volatile memory array with different assistant features design. The computer device is coupled to, or is included in, a semiconductor manufacturing assembly line for controlling at least portions of the same relating to lithography. In particular, the computing device 100 control the lithograph process to provide random weight initialization for main features as described in further detail herein.

The computing device 100 may be embodied as any type of computation or computer device capable of performing the functions described herein, including, without limitation, a computer, a server, a rack based server, a blade server, a workstation, a desktop computer, a laptop computer, a notebook computer, a tablet computer, a mobile computing device, a wearable computing device, a network appliance, a web appliance, a distributed computing system, a processor-based system, and/or a consumer electronic device. Additionally or alternatively, the computing device 100 may be embodied as a one or more compute sleds, memory sleds, or other racks, sleds, computing chassis, or other components of a physically disaggregated computing device. As shown in FIG. 1, the computing device 100 illustratively includes the processor 110, an input/output subsystem 120, a memory 130, a data storage device 140, and a communication subsystem 150, and/or other components and devices commonly found in a server or similar computing device. Of course, the computing device 100 may include other or additional components, such as those commonly found in a server computer (e.g., various input/output devices), in other embodiments. Additionally, in some embodiments, one or more of the illustrative components may be incorporated in, or otherwise form a portion of, another component. For example, the memory 130, or portions thereof, may be incorporated in the processor 110 in some embodiments.

The processor 110 may be embodied as any type of processor capable of performing the functions described herein. The processor 110 may be embodied as a single processor, multiple processors, a Central Processing Unit(s) (CPU(s)), a Graphics Processing Unit(s) (GPU(s)), a single or multi-core processor(s), a digital signal processor(s), a microcontroller(s), or other processor(s) or processing/controlling circuit(s).

The memory 130 may be embodied as any type of volatile or non-volatile memory or data storage capable of performing the functions described herein. In operation, the memory 130 may store various data and software used during operation of the computing device 100, such as operating systems, applications, programs, libraries, and drivers. The memory 130 is communicatively coupled to the processor 110 via the I/O subsystem 120, which may be embodied as circuitry and/or components to facilitate input/output operations with the processor 110 the memory 130, and other components of the computing device 100. For example, the I/O subsystem 120 may be embodied as, or otherwise include, memory controller hubs, input/output control hubs, platform controller hubs, integrated control circuitry, firmware devices, communication links (e.g., point-to-point links, bus links, wires, cables, light guides, printed circuit board traces, etc.) and/or other components and subsystems to facilitate the input/output operations. In some embodiments, the I/O subsystem 120 may form a portion of a system-on-a-chip (SOC) and be incorporated, along with the processor 110, the memory 130, and other components of the computing device 100, on a single integrated circuit chip.

The data storage device 140 may be embodied as any type of device or devices configured for short-term or long-term storage of data such as, for example, memory devices and circuits, memory cards, hard disk drives, solid state drives, or other data storage devices. The data storage device 140 can store program code for random weight initialization of non-volatile memory array with different assistant features design. The communication subsystem 150 of the computing device 100 may be embodied as any network interface controller or other communication circuit, device, or collection thereof, capable of enabling communications between the computing device 100 and other remote devices over a network. The communication subsystem 150 may be configured to use any one or more communication technology (e.g., wired or wireless communications) and associated protocols (e.g., Ethernet, InfiniBand®, Bluetooth®, Wi-Fi®, WiMAX, etc.) to effect such communication.

As shown, the computing device 100 may also include one or more peripheral devices 160. The peripheral devices 160 may include any number of additional input/output devices, interface devices, and/or other peripheral devices. For example, in some embodiments, the peripheral devices 160 may include a display, touch screen, graphics circuitry, keyboard, mouse, speaker system, microphone, network interface, and/or other input/output devices, interface devices, and/or peripheral devices.

Of course, the computing device 100 may also include other elements (not shown), as readily contemplated by one of skill in the art, as well as omit certain elements. For example, various other input devices and/or output devices can be included in computing device 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized. These and other variations of the processing system 100 are readily contemplated by one of ordinary skill in the art given the teachings of the present invention provided herein.

As employed herein, the term "hardware processor subsystem" or "hardware processor" can refer to a processor, memory (including RAM, cache(s), and so forth), software (including memory management software) or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs.

Figure 2:
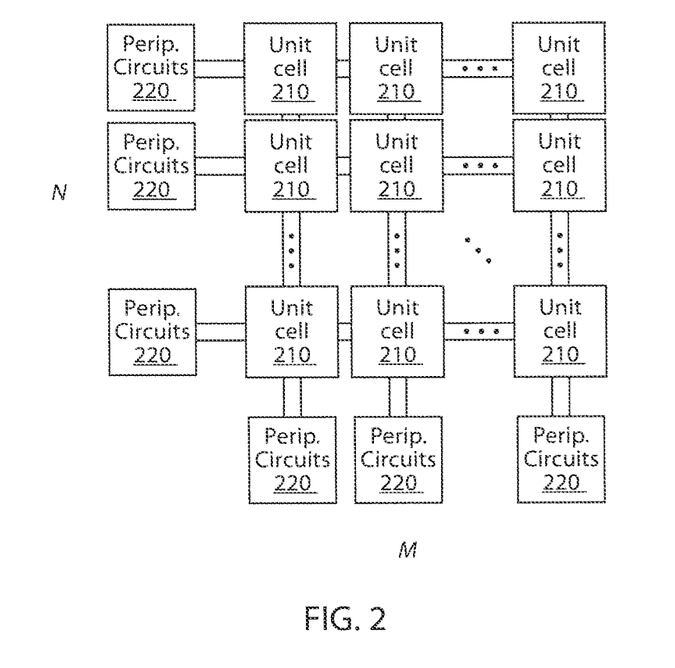
FIG. 2 shows an exemplary Non-Volatile Memory (NVM) crossbar array, in accordance with an embodiment of the present invention.

These and other variations of a hardware processor subsystem are also contemplated in accordance with embodiments of the present invention FIG. 2 shows an exemplary Non-Volatile Memory (NVM) crossbar array 200, in accordance with an embodiment of the present invention.

The NVM crossbar array 200 includes unit cells 210 and peripheral circuits 220. Each unit cell 210 stores a respective weight. The peripheral circuits include functions to generate input signals and to sense output signals and to perform activations functions, such as pulse width modulators, integrators, analog to digital (digital to analog) converters.

With respect to NVM crossbar array, $M_i = \Sigma_j w_{i,j} N_j$, where $M_i$ denotes the total current through the i-th column, $w_{i,j}$ denotes the weight at position (i, j) in the matrix, and $N_j$ denotes the input voltage on the j-th row.

Figure 3:
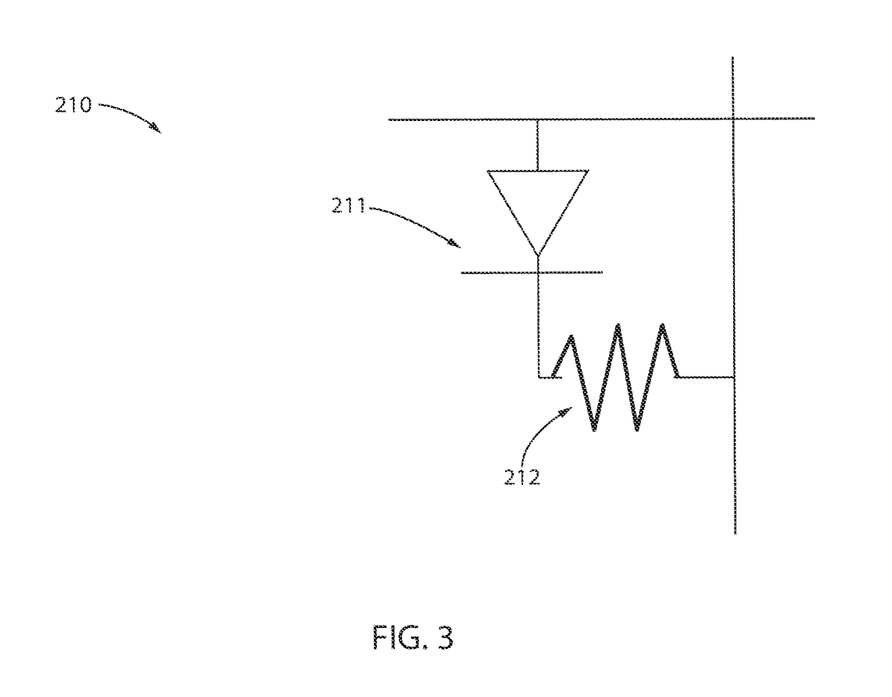
FIG. 3 is a diagram showing an exemplary unit cell of FIG. 2, in accordance with an embodiment of the present invention.

FIG. 3 is a diagram showing an exemplary unit cell 210 of FIG. 2, in accordance with an embodiment of the present invention.

The unit cell 210 includes a selector device 211 and a memory element 212. The memory element can be resistive and so forth.

Figure 4:
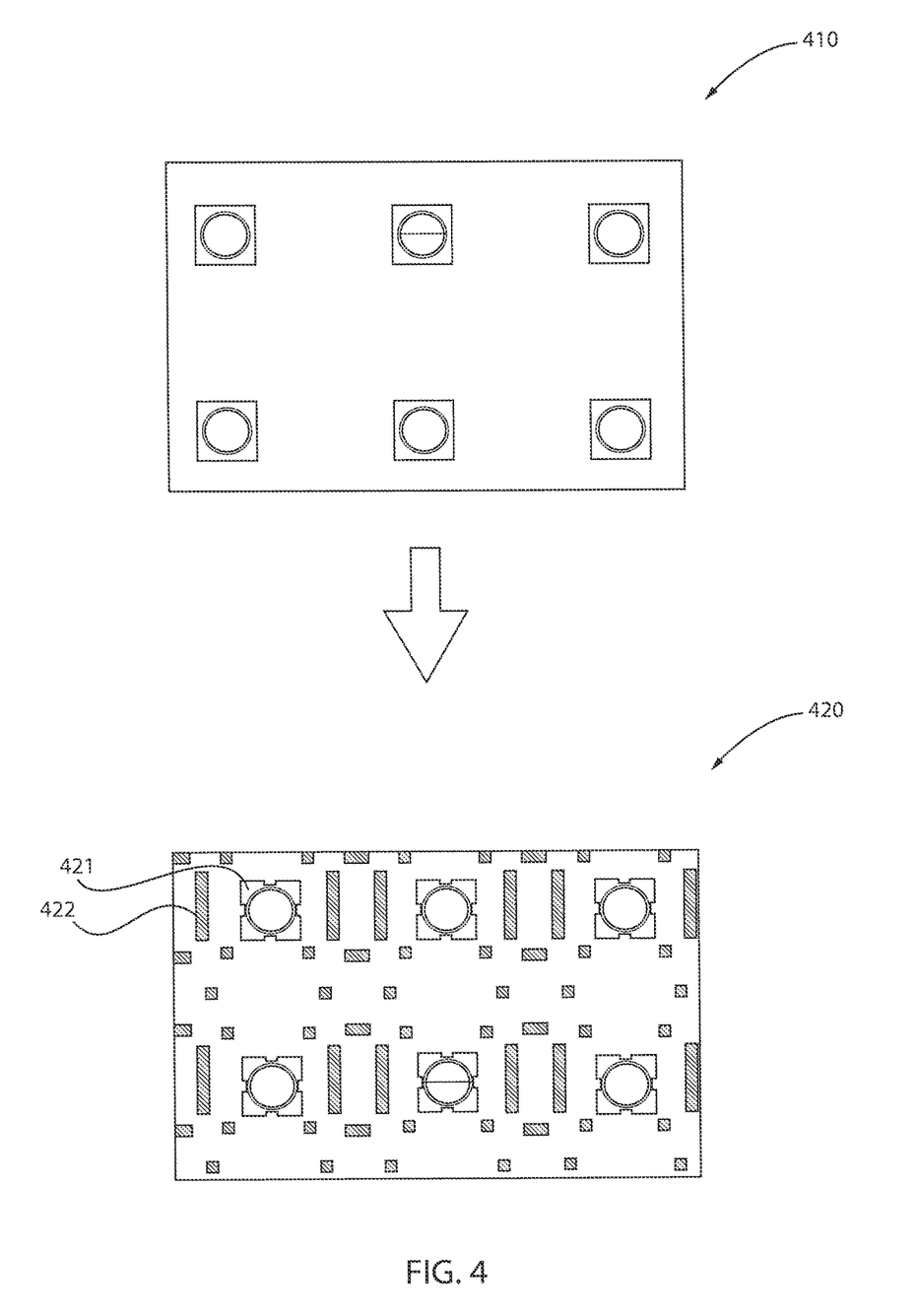
FIG. 4 is a block diagram showing an exemplary lithography contour prior to application of the present invention and then converted to lithography contour in accordance with an embodiment of the present invention.

FIG. 4 is a block diagram showing an exemplary lithography contour 410 prior to application of the present invention and then converted to lithography contour 420 in accordance with an embodiment of the present invention.

As is evident, lithography contour 410 is without SRAFs.

In contrast, each main feature 421 in lithography contour 420 includes corresponding pre-defined different SRAFs 422 to provide different initialization weights for the main features whose shapes can also been modified relative to lithography contour 410 to further differentiate the different initialization weights.

Thus, the same device area is used (as device area is determined by the main feature), but different SRAF patterns are placed within the device area proximate to a main feature to provide a different Local Critical Dimension Uniformity (LCDU) within the device area and a weight initialization for the main feature occupying the device area.

The SRAF may also broaden the critical dimension distribution.

In essence, the SRAFs are used to introduce varying levels of programmable noise into a mask design to provide a respective weight initialization for a respective main feature.

Figure 5:
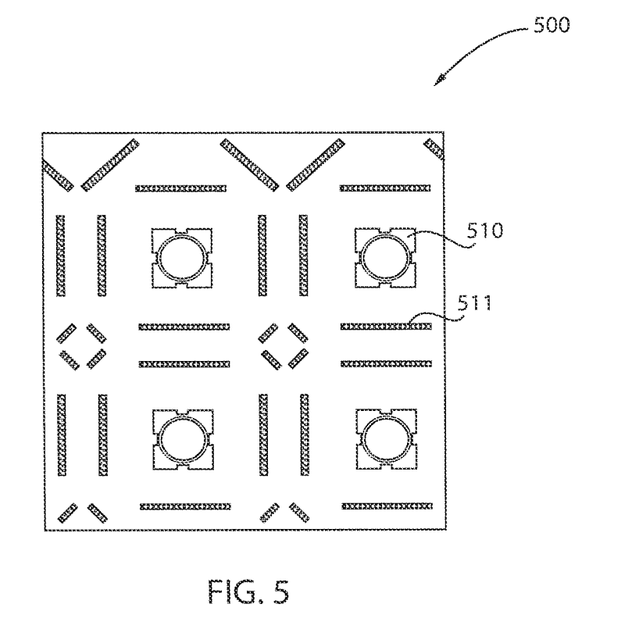
FIG. 5 is a block diagram showing an exemplary SRAF layout with respect to four main features, in accordance with an embodiment of the present invention.

FIG. 5 is a block diagram showing an exemplary SRAF layout 500 with respect to four main features, in accordance with an embodiment of the present invention.

For the sake of not obscuring the elements of FIG. 5, only one of the main features 510 and only one of the SRAFs 511 is indicated by a figure reference numeral.

Figure 6:
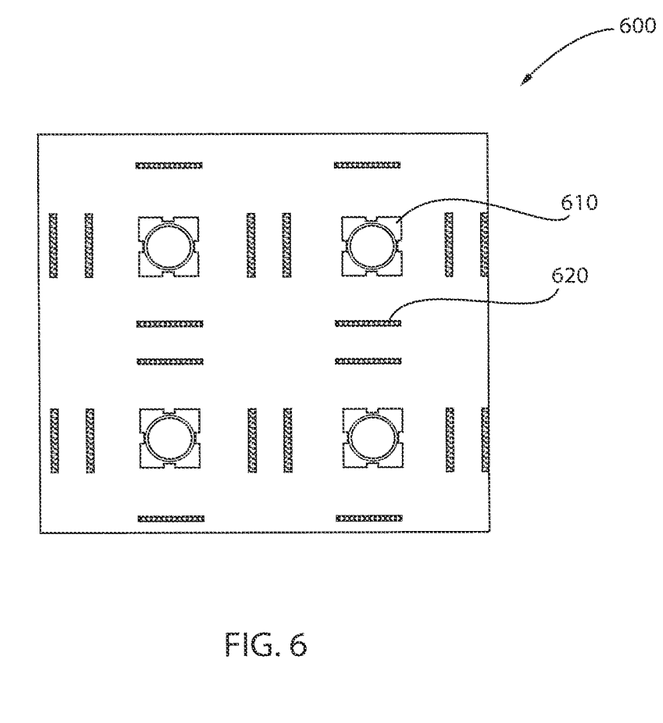
FIG. 6 is a block diagram showing another exemplary SRAF layout with respect to four main features, in accordance with an embodiment of the present invention.

FIG. 6 is a block diagram showing another exemplary SRAF layout 600 with respect to four main features, in accordance with an embodiment of the present invention.

For the sake of not obscuring the elements of FIG. 6, only one of the main features 610 and only one of the SRAFs 611 is indicated by a figure reference numeral.

Figure 7:
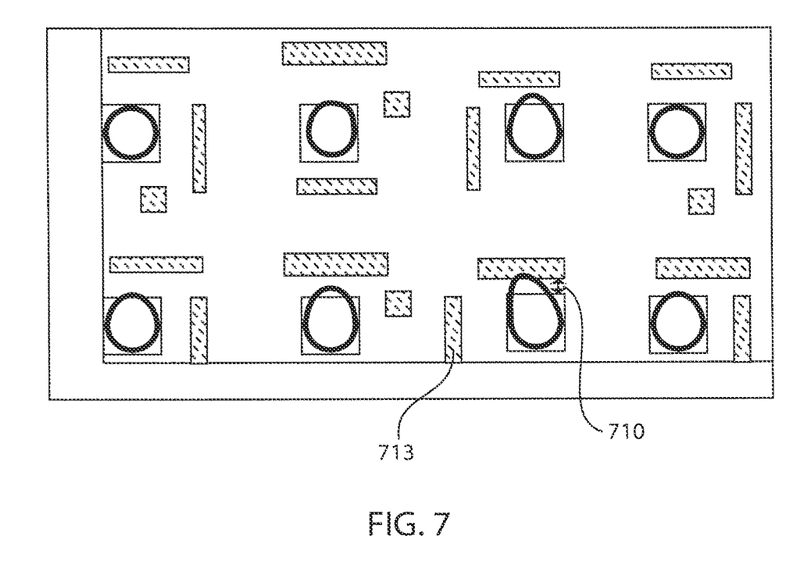
FIG. 7 is a block diagram showing an exemplary pre-corrected SRAF layout having randomized SRAFs in an array, in accordance with an embodiment of the present invention.

As can be seen by the differences in the SRAF layout 500 and the SRAF layout 600, the following allowances/modifications are possible in accordance with the present invention:

(1) placement of assistant features (degree of angles)
(2) distances between assistant features and main feature
(3) distances between assistant features
(4) sizes of assistant features
(5) shapes of assistant features FIG. 7 is a block diagram showing an exemplary pre-corrected SRAF layout 700 having randomized SRAFs in an array, in accordance with an embodiment of the present invention.

Figure 8:
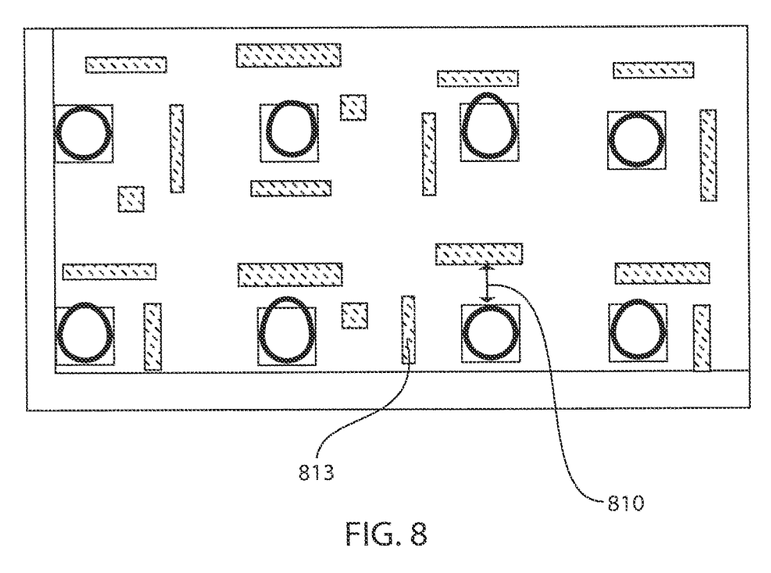
FIG. 8 is a block diagram showing an exemplary post-corrected SRAF layout having randomized SRAFs in an array, in accordance with an embodiment of the present invention.

FIG. 8 is a block diagram showing an exemplary post-corrected SRAF layout 800 having randomized SRAFs in an array, in accordance with an embodiment of the present invention.

In the scenario of FIG. 7, random SRAFs can be applied to induce an even broader size and shape distribution. However, the width and the distance between the main feature to the SRAFs needs to be regulated to avoid defects (which can be done automatically in the design stage).

As shown, a distance 710 in layout 700 from a SRAF 711 to a main feature 712 is increased to distance 810 in layout 800. Moreover, a SRAF design 713 in layout 700 is narrowed as SRAF design 813 in layout 800. In this way, defects are avoided by the SRAF design 711 and/or the SRAF design 713 being too proximate to the main feature 712.

Figure 9:
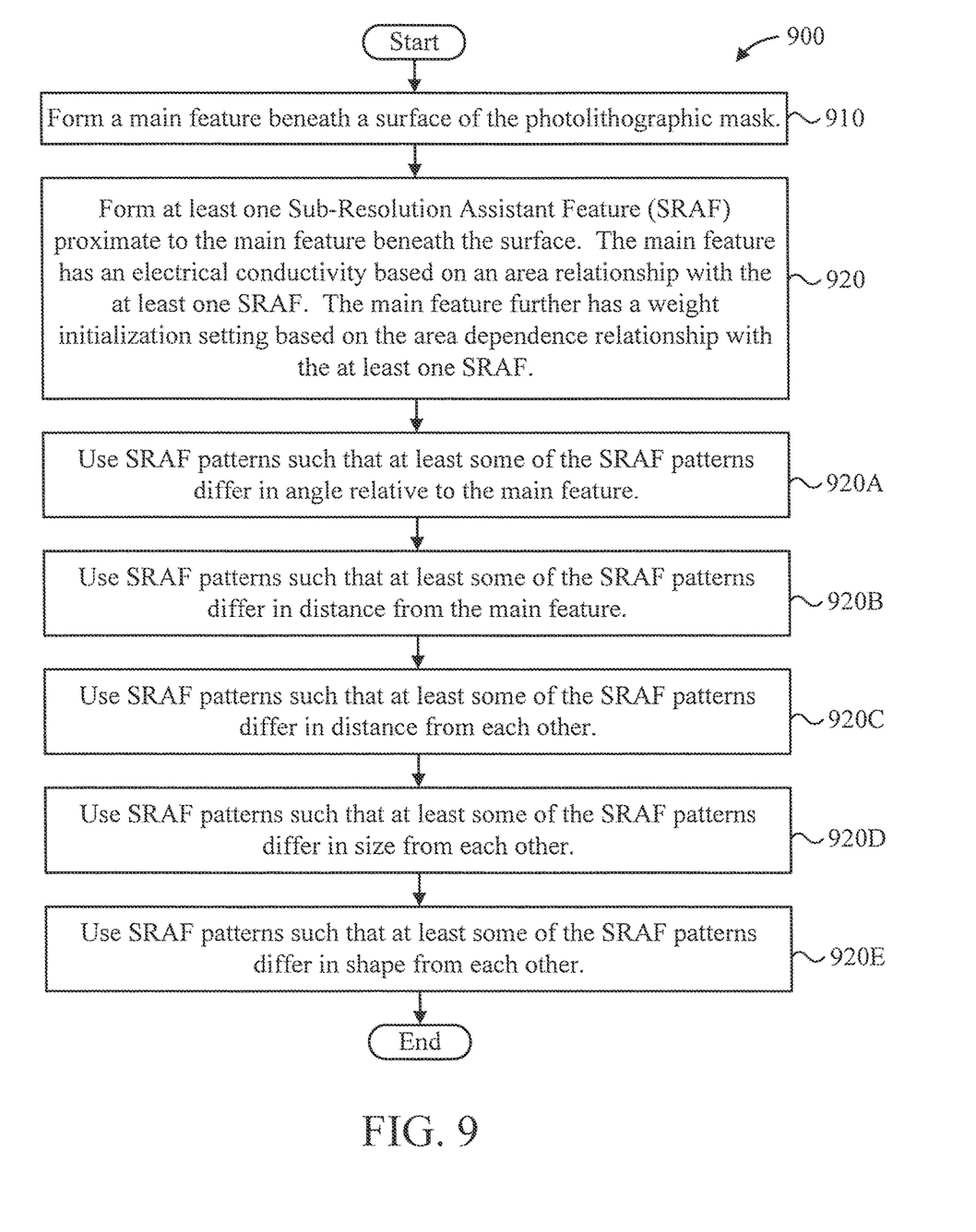
FIG. 9 is a flow diagram showing an exemplary method, in accordance with an embodiment of the present invention.

FIG. 9 is a flow diagram showing an exemplary method 900, in accordance with an embodiment of the present invention.

At block 910, form a main feature beneath a surface of the photolithographic mask.

At block 920, form at least one Sub-Resolution Assistant Feature (SRAF) proximate to the main feature beneath the surface. The main feature has an electrical conductivity based on an area relationship with the at least one SRAF. The main feature further has a weight initialization setting based on the area dependence relationship with the at least one SRAF. In particular, the variance of the feature size is adjusted with the at least one SRAF depending on the number of rows and columns of the crossbar array structure. For one embodiment, the variance is set such that it meets the following relationship: variance=1/(number of rows+number of columns), but the application is not limited to this case. The variance of the feature size will translate to the variance of device conductance, therefore the initial weight randomization is taken care of by the feature design without relying on programming using periphery circuits 220. In an embodiment, block 920 can include one or more of blocks 920A through 920E. Blocks 910A through 910E pertain to one two or more SRAFs are used.

At block 920A, use SRAFs such that at least some of the SRAFs differ in angle relative to the main feature.

At block 920B, use SRAFs such that at least some of the SRAFs differ in distance from the main feature.

At block 920C, use SRAFs such that at least some of the SRAFs differ in distance from each other.

At block 920D, use SRAFs such that at least some of the SRAFs differ in size from each other.

At block 920E, use SRAFs such that at least some of the SRAFs differ in shape from each other.

The mask is then removed, with the main features remaining as elements of the memory device.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A device, comprising:
   a main feature disposed on a surface of a photolithographic mask; and
   Sub-Resolution Assistant Features (SRAFs) proximate to the main feature on the surface, the main feature being sized to generate a device area on a memory device based on an area dependence relationship with the SRAFs, the SRAFs to introduce programmable noise that provide a distribution of weight initialization for the main feature to provide initialization weights for a neural network.

2. The device of claim 1, wherein the SRAFs are formed as unconnected metal shapes.

3. The device of claim 1, wherein the SRAFs comprise a plurality of quadrilaterals around the main feature.

4. The device of claim 3, wherein at least some of the plurality of quadrilaterals around the main feature are different sizes.

5. The device of claim 3, wherein distances of assistant features represented by the plurality of quadrilaterals with respect to the main feature are unequal.

6. The device of claim 1, wherein the initialization weights represent an electrical conductivity that includes a value representative of geometric properties of the SRAFs.

7. The device of claim 1, wherein the SRAFs and corresponding main feature are distributed in an array.

8. The device of claim 6, wherein each of the SRAFs provide a different contribution to the electrical conductivity based on the area dependence relationship.

9. The device of claim 7, wherein at least some of the SRAFs differ in angle relative to the main feature.

10. The device of claim 7, wherein at least some of the SRAFs differ in distance from the main feature.

11. The device of claim 7, wherein at least some of the SRAFs differ in distance from each other.

12. The device of claim 7, wherein at least some of the SRAFs differ in size from each other.

13. The device of claim 7, wherein at least some of the SRAFs differ in shape from each other.

14. A method for forming a device, comprising:
    forming a main feature disposed on a surface of a photolithographic mask; and
    forming Sub-Resolution Assistant Features (SRAFs) proximate to the main feature on the surface, the main feature being sized to generate a device area on a memory device based on an area dependence relationship with the SRAFs, the SRAFs to introduce programmable noise that provide a distribution of weight initialization for the main feature to provide initialization weights for a neural network.

15. The method of claim 14, wherein the SRAFs are formed as an unconnected metal shape.

16. The method of claim 14, wherein the SRAFs comprises a plurality of quadrilaterals around the main feature.

17. The method of claim 14, wherein the memory device includes a plurality of main features, each of the plurality of main features having a respective weight initialization value.

18. The method of claim 14, further comprising adding the programmable noise in a mask level defined by the SRAFs.

19. The method of claim 18, wherein the programmable noise is controlled based on a shape of the main feature and a random injection of a modified shape of the main feature with the SRAFs.

20. A device, comprising:
    a plurality of main features disposed on a surface of a photolithographic mask; and
    respective Sub-Resolution Assistant Features (SRAFs) proximate to each of the plurality of main features on the surface, each of the plurality of main features being sized to generate a device area on a memory device based on an area dependence relationship with the SRAFs proximate thereto, the SRAFs to introduce programmable noise that provide a distribution of weight initialization for the plurality of main features to provide initialization weights for a neural network.

* * * * *